United States Patent
Riker et al.

(10) Patent No.: US 9,960,021 B2
(45) Date of Patent: May 1, 2018

(54) PHYSICAL VAPOR DEPOSITION (PVD) TARGET HAVING LOW FRICTION PADS

(71) Applicant: APPLIED MATERIALS, INC., Santa Clara, CA (US)

(72) Inventors: Martin Lee Riker, Milpitas, CA (US); Uday Pai, San Jose, CA (US); William Fruchterman, Santa Clara, CA (US); Keith A. Miller, Mountain View, CA (US); Muhammad M. Rasheed, San Jose, CA (US); Thanh X. Nguyen, San Jose, CA (US); Kirankumar Savandaiah, Bangalore (IN)

(73) Assignee: APPLIED MATERIALS, INC., Santa Clara, CA (US)

( * ) Notice: Subject to any disclaimer, the term of this patent is extended or adjusted under 35 U.S.C. 154(b) by 303 days.

(21) Appl. No.: 14/182,831

(22) Filed: Feb. 18, 2014

(65) Prior Publication Data
US 2015/0170888 A1    Jun. 18, 2015

Related U.S. Application Data

(60) Provisional application No. 61/917,630, filed on Dec. 18, 2013.

(51) Int. Cl.
*H01J 37/34* (2006.01)
*C23C 14/34* (2006.01)

(52) U.S. Cl.
CPC ...... *H01J 37/3414* (2013.01); *C23C 14/3407* (2013.01); *H01J 37/3411* (2013.01); *H01J 37/3423* (2013.01); *H01J 37/3435* (2013.01)

(58) Field of Classification Search
CPC ............. C23C 14/3407; H01J 37/3411; H01J 37/3414; H01J 37/3435; H01J 37/3423
See application file for complete search history.

(56) References Cited

U.S. PATENT DOCUMENTS

| | | | |
|---|---|---|---|
| 5,487,822 A * | 1/1996 | Demaray et al. | 204/298.09 |
| 5,607,124 A * | 3/1997 | Earley | E04D 13/08 248/48.1 |
| 5,658,442 A | 8/1997 | Van Gogh et al. | |
| 5,690,795 A * | 11/1997 | Rosenstein et al. | 204/192.1 |
| 6,149,776 A | 11/2000 | Tang et al. | |
| 6,297,595 B1 * | 10/2001 | Stimson | H01J 37/32477 315/111.21 |
| 6,416,634 B1 | 7/2002 | Mostovoy et al. | |
| 6,419,806 B1 * | 7/2002 | Holcomb et al. | 204/298.12 |
| 6,730,174 B2 * | 5/2004 | Liu | H01J 37/32477 118/715 |
| 7,618,520 B2 | 11/2009 | Wu et al. | |
| 7,922,881 B2 * | 4/2011 | Ivanov et al. | 204/298.12 |
| 2002/0162741 A1 | 11/2002 | Gogh | |

* cited by examiner

*Primary Examiner* — Michael A Band
(74) *Attorney, Agent, or Firm* — Moser Taboada; Alan Taboada

(57) ABSTRACT

Embodiments of target assemblies for use in substrate processing chambers are provided herein. In some embodiments, a target assembly includes a plate comprising a first side including a central portion and a support portion; a target disposed on the central portion; a plurality of recesses formed in the support portion; and a plurality of pads partially disposed in the plurality of recesses.

13 Claims, 4 Drawing Sheets

PHYSICAL VAPOR DEPOSITION (PVD) TARGET HAVING LOW FRICTION PADS

CROSS-REFERENCE TO RELATED APPLICATIONS

This application claims benefit of U.S. provisional patent application Ser. No. 61/917,630, filed Dec. 18, 2013, which is herein incorporated by reference.

FIELD

Embodiments of the present invention generally relate to semiconductor processing equipment.

BACKGROUND

Physical vapor deposition (PVD) is commonly utilized for forming thin layers of material on substrates, for example semiconductor substrates. A sputtering target, usually including a backing plate, is provided proximate to a substrate within an appropriate chamber and forming an upper portion of a PVD sputter chamber. The backing plate often rests on a ceramic insulating ring. In some processes, the temperature of the target and the chamber increases during processing thermal expansion of the target backing plate and the chamber wall. The thermal expansion of the target backing plate and the chamber wall may be different, and have been observed by the inventors to cause the target backing plate and the insulating ring to move relative to each other, causing friction. The friction has been observed to cause the backing plate and the insulating ring to grind together, causing portions of the backing plate to wear at the interface. The worn material may contaminate the chamber.

Accordingly, the inventors have provided a target assembly that may advantageously reduce the friction at an interface between the target and the PVD chamber.

SUMMARY

Embodiments of target assemblies for use in substrate processing chambers are provided herein. In some embodiments, a target assembly includes a plate comprising a first side including a central portion and a support portion; a target disposed on the central portion; a plurality of recesses formed in the support portion; and a plurality of pads partially disposed in the plurality of recesses.

In some embodiments, a target assembly for a substrate processing chamber includes a plate comprising a first side including a central portion and a support portion; a groove formed in the plate separating the support portion into an atmospheric side radially outward from the groove and a vacuum side radially inward from the groove; a sputtering surface disposed on the central portion extending from a central position to a first radial position; a plurality of recesses formed in the atmospheric side of the support portion and circumferentially spaced about the plate; and a plurality of friction reducing pads partially disposed in the plurality of recesses such that a bearing surface is spaced above the first side of the plate.

In some embodiments, a substrate processing apparatus may include a chamber body, a lid disposed atop the chamber body, a target assembly coupled to the lid, the target assembly including a backing plate having a first side and an opposing second side, a target material bonded to the first side of the backing plate, a plurality of recesses formed in the backing plate, and a plurality of pads partially disposed in the plurality of recesses, each pad having a bearing surface, a support member coupled to the lid proximate an outer end of the support member and extending radially inward, and a seal ring disposed between the backing plate and the support member wherein the seal ring is supported by the support member along a bottom surface of the seal ring, and wherein a top surface of the seal ring contacts the target assembly along the bearing surfaces of the plurality of pads.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for embodiments of the invention may admit to other equally effective embodiments.

Figure 1:
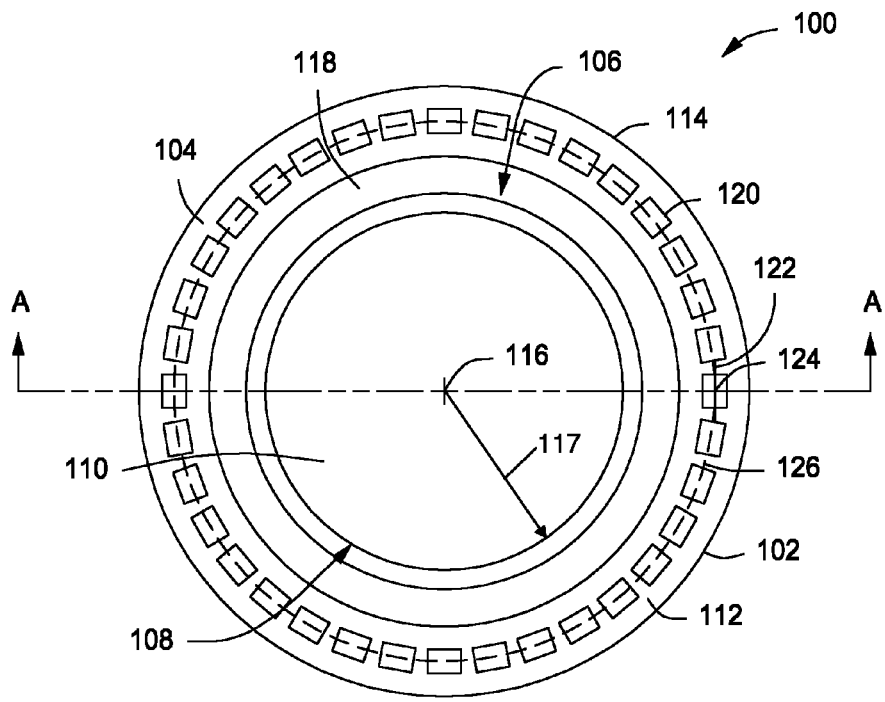
FIG. 1 depicts a bottom view of a target assembly in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of target assemblies for use in substrate processing chambers, such as for a physical vapor deposition (PVD) chamber, are provided herein. The inventive target assemblies may advantageously reduce friction between the target assembly and a support member of the process chamber that supports the target assembly. The reduction in friction may beneficially reduce wear of the support member or the target assembly and advantageously reduce contamination of the chamber by the worn material.

Embodiments of the invention may be better understood with simultaneous reference to FIGS. 1 and 2 in which FIG. 1 is a bottom view and FIG. 2 is a side sectional view.

FIG. 1 depicts a bottom view of a target assembly 100 in accordance with embodiments of the present invention. Target assembly 100 may be used with any suitable substrate processing chamber, for example any of the ENDURA® models of physical vapor deposition (PVD) chambers available from Applied Materials, Inc., of Santa Clara, Calif. An exemplary PVD chamber including target assembly 100 is described below with respect to FIG. 4. The apparatus described herein may also be beneficially used with other process chambers. The target assembly 100 may be advantageously used with chambers configured to process 200 mm, 300 mm, or 450 mm diameter substrates, although chambers configured to process other size substrates may similarly benefit.

The target assembly 100 includes a target backing plate 102 having a first side 104 comprising a central portion 106 and a support portion 112. The target assembly 100 includes a source material 108 to be deposited on a substrate. The source material 108 is centrally disposed on the backing plate 102, extending from a central position corresponding to central point 116 to a first radial position 117. The source material 108 includes a sputtering surface 110 raised (outwardly offset) from and directed away from the backing plate 102. In some embodiments, the source material 108 may be affixed to the first side 104 using an appropriate bonding process, for example diffusion bonding, or mechanically attached to the backing plate 102. Although referred to as an assembly, the target assembly 100 may be a monolithic member. For example, in some embodiments, the source material 108 and the backing plate 102 may be integrally formed from the same material.

The support portion 112 is disposed radially outward from the central portion 106 and extends outward, in some embodiments to the outer perimeter 114, at a distance R1 from a central point 116 of the backing plate 102. The support portion 112 may include a channel or o-ring groove, groove 118, circumscribing the central portion 106 and centrally located at a distance R2 from the central axis 204 through central point 116. The groove 118 is configured to retain a sealing element (sealing element 490 in FIG. 4), such as an o-ring or gasket, to facilitate formation of a seal with a portion of a chamber, for example with in insulating ring of a PVD chamber. The groove 118 may be a square groove as shown, or may be of any other shape, including as non-limiting examples semicircular or dovetail (i.e., the sidewalls of the groove diverge and the base is larger than the opening).

The groove 118 separates the support portion 112 into an atmospheric side 206 radially outward from the groove 118 and a vacuum side 208 radially inward from the groove 118. The vacuum portion may extend to the central axis 204 and includes the central portion 106 of the backing plate 102 and the source material 108.

A plurality of recesses 120 are formed in the atmospheric side 206 of the support portion 112, through the first side 104 and partially through the thickness T of the backing plate 102. As illustrated in FIG. 1, 36 recesses 120 are formed in the backing plate 102, although a greater number or a lesser number may also be formed.

The recesses 120 are illustrated to be of a similar size and of the same, or similar, rectangular cross-section for ease of illustration only. In embodiments where the recesses 120 are rectangular, the recesses 120 may be evenly spaced apart angularly around the plate and aligned along a circular path 126 (shown as a dashed line) centered at the central axis 204 such that the longitudinal axis 122 of each of the rectangular recesses is tangent at the midpoint 124 of the axis 122 to the circular path 126. The longitudinal axis 122 may be a major axis, i.e., the axis parallel to the longer sides of the recess 120. The size and number of recesses may be chosen such that the sum of the axial lengths, i.e., the total axial length, of each longitudinal axis 122 of the plurality of recesses is between about 25% and about 75%, for example about 50%, of the length of the circular path to which the recesses 120 are aligned.

Figure 3:
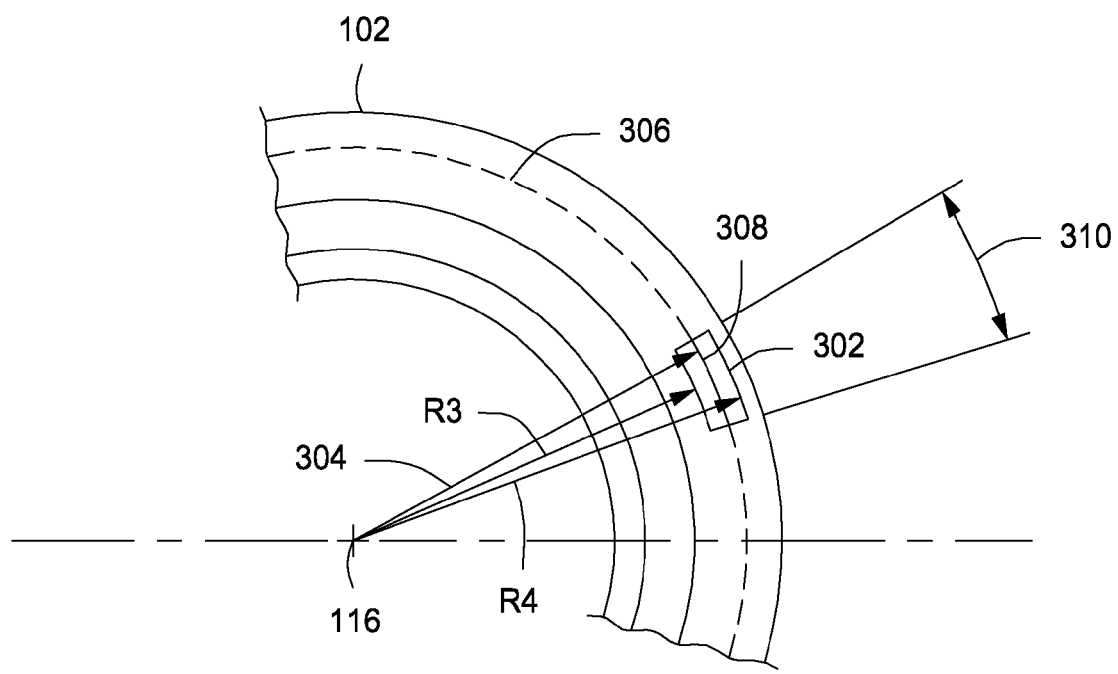
FIG. 3 depicts a schematic view of a portion of a target assembly in accordance with some embodiments of the present invention.

In some embodiments, and as shown in FIG. 3, the recesses may be arcuate recesses 302 (i.e., have an arcuate cross section) having an inner radius corresponding to R3 and an outer radius corresponding to R4. The arcuate recesses may be bound by radial lines including an angle 310 of between about 2.5 degrees and about 7.5 degrees, for example about 5 degrees.

In some embodiments, the arcuate recesses 302 are aligned such that an intermediate radius 304 located between, and parallel to, the inner radius R3 and the outer radius R4 of each of the arcuate recesses 302 lies along a circular path 306 (shown as dashed line) centered at a central point 116 of the backing plate 102. The size and number of the arcuate recesses 302 may be chosen such that the intermediate radius 304 has an arc length 308, wherein the sum of the arc lengths 308, i.e., the total arc length, of each of the plurality of arcuate recesses 302 is between about 25% and about 75%, for example about 50%, of the length of the circular path.

Other cross-sectional shapes may be used for the recesses 120, including as non-limiting examples, circular, oval, pentagonal, or other curvilinear or polygonal shapes.

Figure 2A:
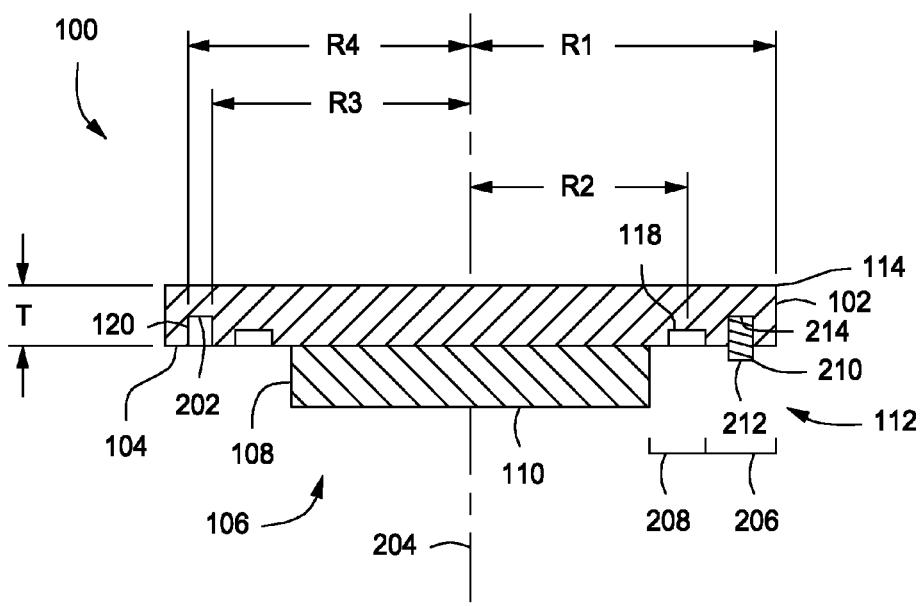
FIG. 2A depicts a sectional view of the target assembly of FIG. 1 taken along line A-A.

As illustrated in FIG. 2A, a pad 210 is partially disposed in a recess 120 such that a bearing surface 212 of the pad 210 is spaced above (i.e., stands proud of) the first side 104 and a seating surface 214 of the pad 210 is supported by the bottom surface 202 of the recess 120 against further displacement into the backing plate 102. Only one pad 210 is shown for clarity although pads 210 are disposed about the target assembly 100 in sufficient number to support the target assembly 100 as described herein. In some embodiments, a pad 210 is partially disposed in each of the plurality of recesses 120. In other embodiments, a pad 210 is disposed in some of the recesses 120, for example in alternating recesses or in some other pattern of recesses. In some embodiments of the present invention, the bearing surface 212 is spaced above the first side 104 by about 0.05 mm to about 1 mm, for example about 0.75 mm.

Figure 2B:
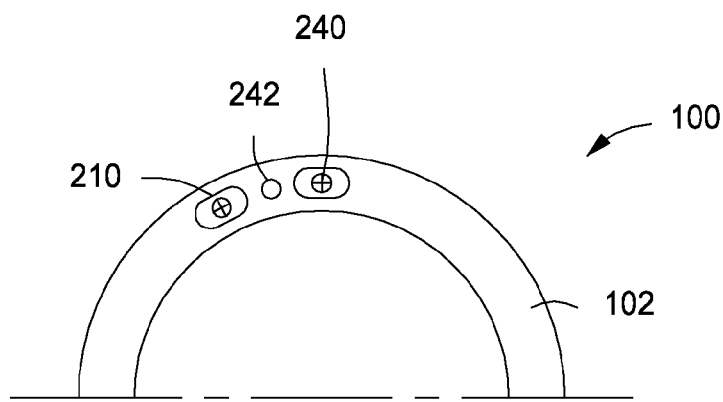
FIG. 2B depicts a partial bottom view of a target assembly in accordance with some embodiments of the present invention.

In some embodiments, each of the pads may be secured in a corresponding recess 120 using a fastener 240, as shown in FIG. 2B. The fasteners may be bolts, screws, rivets, or other types of fasteners disposed through the pad 210. As shown in FIG. 2B, one or more pads 210 may be disposed proximate a backing plate fastener 242 that secures the backing plate to the process chamber in some embodiments, for example, on both sides of backing plate fastener 242. In other embodiments, the fastener 240 used to secure the pad 210 to backing plate 102 may also extend through the backing plate 102 to secure the backing plate 102 to the process chamber. The pads 210 may alternatively or in combination be disposed in other locations along the backing plate 102.

Figure 2C:
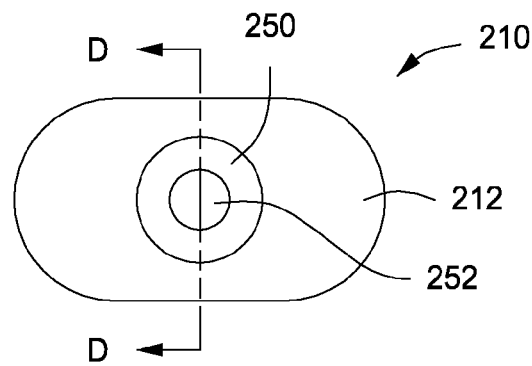
FIG. 2C depicts a top view of an exemplary contact pad of a target assembly in accordance with some embodiments of the present invention.
Figure 2D:
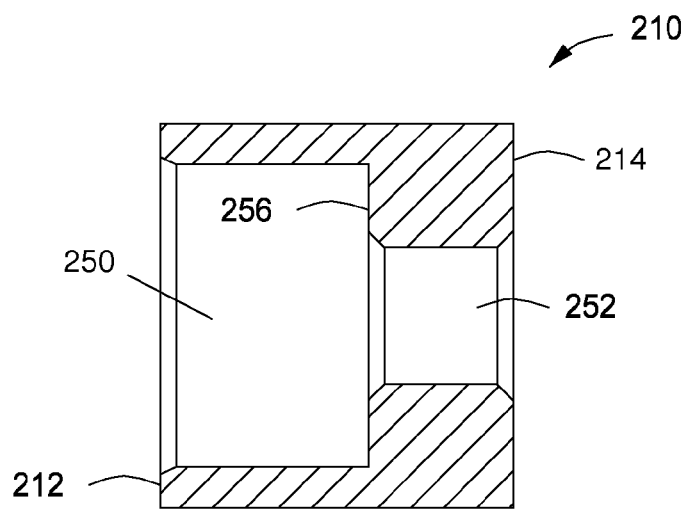
FIG. 2D depicts a side view of the contact pad of FIG. 2C along line D-D.

FIGS. 2C and 2D are top and cross-sectional (along line D-D) side views, respectively, of an exemplary pad 210 that may be secured to backing plate 102 via a fastener 240. As shown in FIG. 2C, the pad 210 includes a bearing surface 212, a countersunk recess 250 having a first diameter that extends partially into the body of the pad 210, and a through hole 252 having a second diameter that is smaller than the first diameter. The fastener 240 may be disposed in the countersunk recess 250 and through hole 252 such that the head of fastener 240 is either countersunk below the bearing surface 212 (i.e., such that the head of fastener 240 does not contact the seal ring 481 discussed below with respect to FIG. 4), or such that the head of fastener 240 is planar with the bearing surface 212. The head of fastener 240 will interface with surface 256 of pad 210. The shaft of fastener 240 will be disposed through hole 252 to secure the pad 210 to the backing plate 102. The seating surface 214 of pad 210 will interface with the bottom surface 202 of the recess 120.

In some embodiments, the pad 210 and recess 120 are sized such that an interference fit is established when the pad 210 is partially disposed in the recess 120. Each of the pads 210 may be press fit into one of the recesses to provide interference with at least one dimension of the recess. In a non-limiting example, the interference is about 0.15 mm along an edge of the recess 120, i.e., a dimension of the pad 210 is about 0.15 mm longer than the corresponding dimension of the recess 120. In some embodiments having pads 210 rectangular in shape, the bearing surface 212 may have dimensions of about 10 mm by about 28 mm and a depth perpendicular to the bearing surface of about 8 mm. Other dimensions may also be used dependent upon chamber configuration, target size, pad geometry, or the like.

In some embodiments, the pads 210 are individually removable from the recesses 120, for example, to replace a damaged pad. A removed pad may be easily replaced at a low cost with a replacement pad of the same configuration as pad 210 and press fit into the recess 120 using any appropriate method, including manually.

The pads 210 are formed from a process compatible material that has a low coefficient of friction and a high yield strength to withstand and vacuum forces or other substrate processing environment loads. Some non-limiting examples of materials that may be used for the pads include as ultra-high-molecular-weight polyethylene (UHMWPE), polyether ether ketone (PEEK), polytetrafluoroethylene (PTFE), acetal homopolymer resins such as DELRIN®, and the like.

The inventors have observed a transfer of material between the insulating ring and the target in conventional PVD chambers. The transferred material is understood to be the result of friction, and resulting grinding, between a support member of the process chamber, such as the seal ring 481 described below with respect to FIG. 4, and the target assembly 100 due to movement between the two components resulting from, among other things, thermal load and vacuum load. The grinding also has been observed to abrade material from one or both of the components. The abraded material may enter and contaminate the chamber during processing. The contamination has been observed to cause, among other things, arcing in the chamber and the associated negative impact on processing results.

The inventors have observed that reduced friction between the target and the insulator ring can reduce the abrasion and transfer of materials. Target assemblies in accordance with embodiments of the present invention reduce friction between the two components in a number of ways. The individual pads spaced apart from each other provide discrete contact points between the insulator ring and the target. Materials selected for the pads may be any material with appropriate mechanical properties, including, for example, heat resistance, coefficient of friction, and working strength. A target including pads formed from a material having a working strength appropriate for the application, and a low coefficient of friction (such as UHMWPE, PEEK, PTFE, and acetal homopolymer resins), has been observed to reduce the friction force compared to a target not including the inventive pads.

The inventive pads provide contact at limited points, reducing the sources of friction to only those contact points. In the areas of the support portion of the target not including the inventive pads, the target and the insulator ring remain spaced apart and provide no friction force. By minimizing contact to the individual pads, friction is reduced as compared to, for example, a ring separating the support member and the target assembly.

The inventors have also observed that it is easier to maintain a close tolerance with the individual inventive pads as compared to a complete ring. Maintaining the close tolerance may facilitate improved sealing of the target assembly 100 to a chamber. The inventors have also noted that the recesses 120 and pads 210 may be consistently sized for current chamber sizes (i.e., chambers for processing 200, 300, and 450 mm diameter substrates). The individual pads may also be compatible with future size chambers. In addition, the individual pads are easier to install and maintain as compared to a ring.

Figure 4:
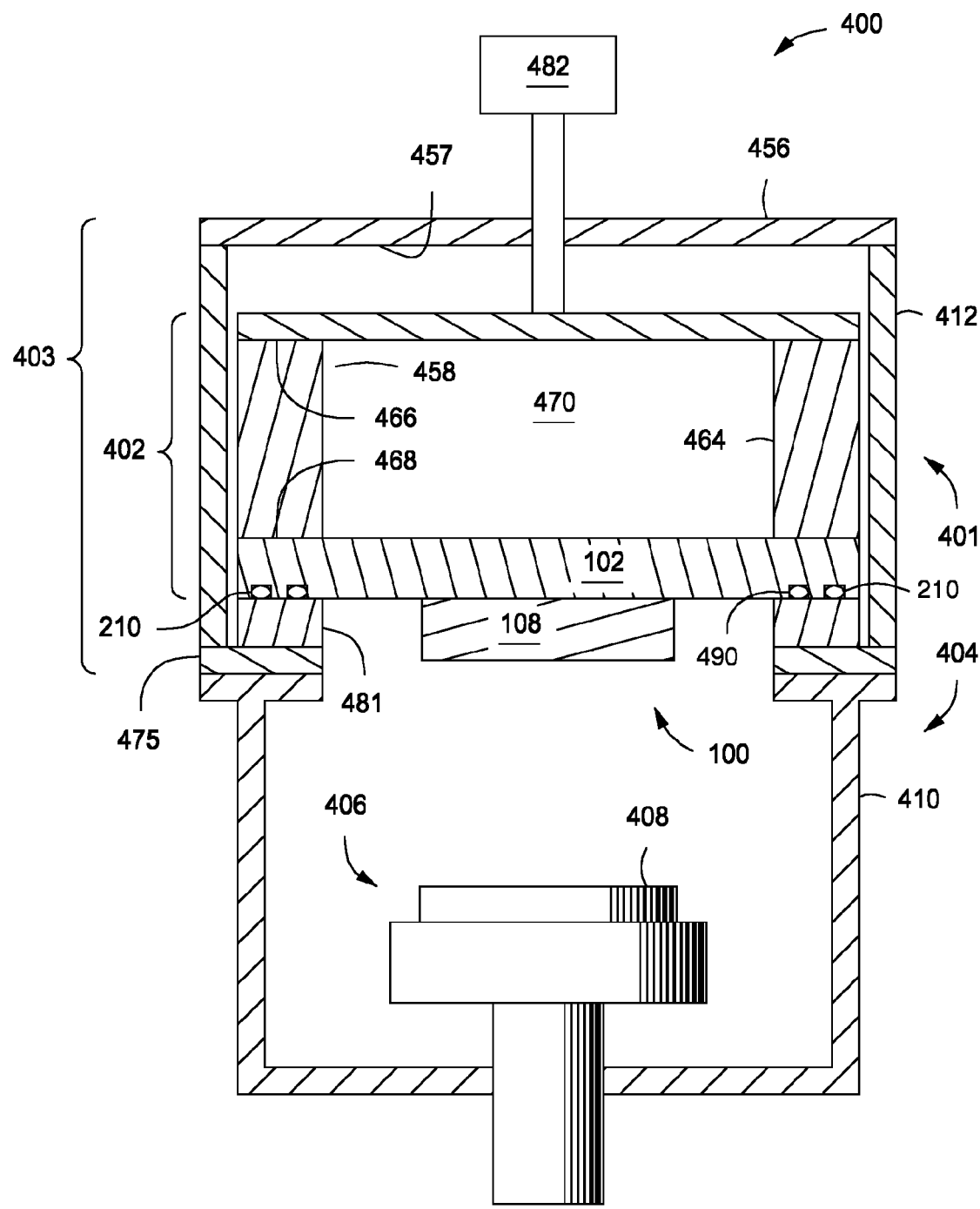
FIG. 4 depicts a process chamber having a target assembly in accordance with some embodiments of the present invention.

FIG. 4 depicts a simplified schematic cross-sectional view of a physical vapor deposition (PVD) chamber 400 having a target assembly 100 in accordance with embodiments of the present invention.

In some embodiments of the present invention, the PVD chamber 400 includes a chamber lid 401 disposed atop a process chamber 404 and removable from the process chamber 404. The chamber lid 401 may include an inner assembly 402 and an outer grounding assembly 403. The process chamber 404 contains a substrate support 406 for receiving a substrate 408 thereon. The substrate support 406 may be located within a lower grounded enclosure wall 410, which may be a chamber wall of the process chamber 404. The lower grounded enclosure wall 410 may be electrically coupled to the grounding assembly 403 of the chamber lid 401 such that an RF return path is provided to an RF power source 482 disposed above the chamber lid 401.

The chamber lid 401 generally includes the grounding assembly 403 disposed about the inner assembly 402. The grounding assembly 403 may include a grounding plate 456 having a first surface 457 that may be generally parallel to and opposite a backside of the inner assembly 402. A grounding shield 412 may extending from the first surface 457 of the grounding plate 456 and surround the inner assembly 402. The grounding assembly 403 may include a support member 475 to support the inner assembly 402 within the grounding assembly 403.

The inner assembly 402 may include a source distribution plate 458 opposing a backside of the target assembly 100 and electrically coupled to the target assembly 100 along a peripheral edge of the target assembly 100. As discussed above, the target assembly 100 may comprise a source material 108 to be deposited on a substrate, such as the substrate 408 during sputtering. The source material 108 may be comprised of metal, metal oxide, metal alloy, or the like. In some embodiments, the target assembly 100 includes a backing plate 102 to support the source material 108. The source material 108 may be disposed on a substrate support facing side of the backing plate 102 as illustrated in FIG. 4. The backing plate 102 may comprise a conductive material, such as copper, copper-zinc, copper-chrome, or the same material as the target, such that RF and DC power can be coupled to the source material 108 via the backing plate 102. Alternatively, the backing plate 102 may be non-conductive and may include conductive elements (not shown) such as electrical feedthroughs or the like. The backing plate 102 includes a groove 118 to retain sealing element 490, and one or more recesses 120 to retain pad(s) 210.

In some embodiments, the support member 475 may be coupled to a lower end of the grounding shield 412 proximate an outer peripheral edge of the support member 475 and extends radially inward to support a seal ring 481, and the inner assembly 402. The seal ring 481 may be a ring or other annular shape having a desired cross-section. The seal ring 481 may include two opposing planar and generally parallel surfaces to facilitate interfacing with backing plate 102 of target assembly 100 of the inner assembly 402, on a first side of the seal ring 481 and with the support member 475 on a second side of the seal ring 481. The seal ring 481 may be made of a dielectric material, such as ceramic. The seal ring 481 may insulate the inner assembly 402 from the ground assembly 403. The seal ring 482 interfaces with backing plate 102 via the bearing surfaces 212 of pads 210. In addition, the sealing element 490 disposed in groove 118 of backing plate 102 also contacts seal ring 481 to form a vacuum seal between backing plate 102 and seal ring 481.

A conductive member 464 may be disposed between a source distribution plate 458 and the backside of the target assembly 100 to propagate RF energy from the source distribution plate to the peripheral edge of the target assembly 100. The conductive member 464 may be cylindrical, with a first end 466 coupled to a target-facing surface of the source distribution plate 458 proximate the peripheral edge of the source distribution plate 458 and a second end 468 coupled to a source distribution plate-facing surface of the target assembly 100 proximate the peripheral edge of the target assembly 100. In some embodiments, the second end 468 is coupled to a source distribution plate facing surface of the backing plate 102 proximate the peripheral edge of the backing plate 102. In some embodiments, the backing plate 102 may be coupled to the second end 468 of conductive member 464 via one or more fasteners.

The inner assembly 402 may include a cavity 470 disposed between the backside of the target assembly 100 and the source distribution plate 458. The cavity 470 may at least partially house a magnetron assembly. The cavity 470 is at least partially defined by the inner surface of the conductive member 464, a target facing surface of the source distribution plate 458, and a source distribution plate facing surface (e.g., backside) of the target assembly 100 (or backing plate 102). In some embodiments, the cavity 470 may be at least partially filled with a cooling fluid, such as water ($H_2O$) or the like.

While the foregoing is directed to embodiments of the present invention, other and further embodiments of the invention may be devised without departing from the basic scope thereof.

The invention claimed is:

1. A target assembly for a substrate processing chamber, comprising:
    a plate comprising a first side including a central portion and a support portion, wherein the central portion is configured to support target source material; a plurality of recesses formed in the support portion; and
    a plurality of pads partially disposed in the plurality of recesses, wherein each of the plurality of pads is secured to the support portion via a fastener disposed through the pad, wherein each of the plurality of pads includes a bearing surface, a countersunk recess having a first diameter that extends partially into a body of the pad, and a through hole having a second diameter that is smaller than the first diameter, and wherein a head of the fastener is disposed within the countersunk recess of the pad below the bearing surface.

2. The target assembly of claim 1, wherein the plurality of recesses are circumferentially spaced around the plate.

3. The target assembly of claim 1, wherein the plurality of recesses are similarly sized.

4. The target assembly of claim 1, wherein the fastener is disposed in the countersunk recess and through hole.

5. The target assembly of claim 4, wherein a shaft of the fastener is disposed through the through hole to secure the pad to the plate.

6. The target assembly of claim 1, wherein each of the plurality of pads comprise a seating surface and a bearing surface, wherein, when the seating surface is supported on a bottom surface of a recess, the bearing surface is spaced above the first side of the plate.

7. The target assembly of claim 6, wherein the bearing surface is spaced about 0.05 mm to about 1 mm above the first side.

8. The target assembly of claim 1, wherein the plate includes a groove separating the support portion into an atmospheric side radially outward from the groove and a vacuum side radially inward from the groove.

9. The target assembly of claim 8, wherein the plurality of recesses are formed in the atmospheric side.

10. The target assembly of claim 1, wherein the plurality of pads are replaceable pads.

11. The target assembly of claim 1, wherein the plurality of pads are formed from one or more of ultra-high-molecular-weight polyethylene or polyether ether ketone.

12. A target assembly for a substrate processing chamber, comprising:
    a plate comprising a first side including a central portion and a support portion, wherein the central portion is configured to support target source material;
    a groove formed in the plate separating the support portion into an atmospheric side radially outward from the groove and a vacuum side radially inward from the groove;
    a plurality of recesses formed in the atmospheric side of the support portion and circumferentially spaced about the plate; and
    a plurality of friction reducing pads partially disposed in the plurality of recesses such that a bearing surface is spaced above the first side of the plate, wherein each of the plurality of friction reducing pads is secured to the support portion via a fastener disposed through the pad, wherein each of the plurality of friction reducing pads includes a bearing surface, a countersunk recess having a first diameter that extends partially into a body of the pad, and a through hole having a second diameter that is smaller than the first diameter, and wherein a head of the fastener is disposed within the countersunk recess of the pad below the bearing surface.

13. The target assembly of claim 12, wherein the groove is configured to retain a sealing element to facilitate formation of a seal between the atmospheric side and vacuum side.

* * * * *